United States Patent
Ishikawa et al.

(10) Patent No.: US 10,398,070 B2
(45) Date of Patent: Aug. 27, 2019

(54) SUCTION NOZZLE

(71) Applicant: FUJI CORPORATION, Chiryu-shi (JP)

(72) Inventors: Kenzo Ishikawa, Kariya (JP);
Yoshimasa Terashita, Wakayama (JP)

(73) Assignee: FUJI CORPORATION, Chiryu-shi (JP)

( * ) Notice: Subject to any disclaimer, the term of this patent is extended or adjusted under 35 U.S.C. 154(b) by 176 days.

(21) Appl. No.: 15/551,332

(22) PCT Filed: Feb. 17, 2015

(86) PCT No.: PCT/JP2015/054232
§ 371 (c)(1),
(2) Date: Aug. 16, 2017

(87) PCT Pub. No.: WO2016/132448
PCT Pub. Date: Aug. 25, 2016

(65) Prior Publication Data
US 2018/0035578 A1 Feb. 1, 2018

(51) Int. Cl.
*H05K 13/04* (2006.01)
*B25J 15/06* (2006.01)

(52) U.S. Cl.
CPC ...... *H05K 13/0408* (2013.01); *B25J 15/0616* (2013.01); *H05K 13/0409* (2018.08)

(58) Field of Classification Search
CPC .............. B25J 15/0616; B25J 15/0683; H05K 13/0408; H05K 13/0409; H05K 13/0404
See application file for complete search history.

(56) References Cited

U.S. PATENT DOCUMENTS

| | | | | |
|---|---|---|---|---|
| 4,474,397 A | * | 10/1984 | Hassan | H01L 21/6838 294/64.3 |
| 5,067,762 A | * | 11/1991 | Akashi | B25J 15/0616 271/97 |
| 5,915,915 A | * | 6/1999 | Allen | B24B 37/345 414/744.1 |

(Continued)

FOREIGN PATENT DOCUMENTS

CN 203872505 U 10/2014
JP 64-89443 A 4/1989

(Continued)

OTHER PUBLICATIONS

Extended Search Report dated Dec. 11, 2017 in European Patent Application No. 15882552.1.

(Continued)

*Primary Examiner* — Gerald McClain
(74) *Attorney, Agent, or Firm* — Oblon, McClelland, Maier & Neustadt, L.L.P.

(57) ABSTRACT

A suction nozzle includes a suction pad portion at a tip of an air pipe formed to be larger than the air pipe, in which a resistance cavity which causes resistance and decreases air flow speed when a positive pressure is applied is formed between a flow path and a cavity portion. In the suction nozzle, since the resistance cavity is formed, a positive pressure is applied by the air whose flow speed is suppressed and the suction release of the component is performed. The resistance cavity may be a cavity having a slit shape.

5 Claims, 6 Drawing Sheets

(56) References Cited

U.S. PATENT DOCUMENTS

| | | | |
|---|---|---|---|
| 6,601,888 B2 * | 8/2003 | McIlwraith | B65G 47/911 294/64.3 |
| 8,904,629 B2 * | 12/2014 | Ryu | B65G 47/911 29/740 |
| 2008/0148558 A1 | 6/2008 | Oh | |
| 2014/0090528 A1 * | 4/2014 | Graf | B29B 11/16 83/23 |

FOREIGN PATENT DOCUMENTS

| | | |
|---|---|---|
| JP | 10-224089 A | 8/1998 |
| JP | 2000-261196 A | 9/2000 |
| KR | 10-1385443 B1 | 4/2014 |
| WO | WO 2008/010616 A1 | 1/2008 |
| WO | WO 2014/033794 A1 | 3/2014 |

OTHER PUBLICATIONS

IBM Technical Disclosure Bulltetin, "Insertion Head for Multi-Size Square Modules", vol. 25, No. 7A, Dec. 1982, XP-001454519, pp. 3423-3424.

International Search Report dated Apr. 7, 2015 in PCT/JP2015/054232 filed Feb. 17, 2015.

\* cited by examiner (a)

(b)

(a)

(b)

(a)

(b)

SUCTION NOZZLE

TECHNICAL FIELD

The present application relates to a suction nozzle, and more particularly to a suction nozzle used in a mounting device for mounting a component on a board.

BACKGROUND ART

In the related art, as a mounting device equipped with a suction nozzle, a mounting device is proposed that includes a nozzle holder which is supported so as to be rotatable around a horizontal shaft and on which multiple nozzles are mounted (see, for example, PTL 1). As a suction nozzle to be mounted on the mounting device, there is disclosed a suction nozzle which has a suction pad portion having a rectangular suction surface with a tip portion larger than a pipe and sucks a relatively large size component.

CITATION LIST

Patent Literature

PTL 1: JP-A-2000-261196

SUMMARY

By the way, in the suction nozzle having the suction pad portion, although a component is sucked by a negative pressure and then a positive pressure is applied to release the suction of the component, a bringing-back phenomenon occurs in which even if the positive pressure is applied, the suction of the component is not successfully released, the component does not separate from the suction nozzle after the component is mounted on a board, and is moved with the suction nozzle.

The present disclosure has been made in view of the above problems and a main object thereof is to provide a suction nozzle which can more reliably perform suction release of a component.

Solution to Problem

The present disclosure adopts following means in order to achieve the main object described above.

The suction nozzle according to the present disclosure is a suction nozzle used in a mounting device for mounting a component on a board, including: an air pipe; and a suction pad portion which has a flow path which communicates with the air pipe, has a cavity portion between the component and the suction pad portion, abuts on the component, and is formed to be larger than the air pipe at a tip of the air pipe, in which a resistance cavity which causes resistance and decreases air flow speed when a positive pressure is applied are formed between the flow path and the cavity portion.

The suction nozzle includes the suction pad portion which is formed to be larger than the air pipe at the tip of the air pipe, and the resistance cavity which causes resistance and decreases air flow speed when a positive pressure is applied is formed between the flow path which communicates with the air pipe and the cavity portion which is formed on the suction pad portion. In general, in a suction nozzle having a suction pad portion, in a case where the resistance cavity is not formed, air having an area corresponding to the sectional area of the flow path from the air pipe reaches the component. On the surface of the component at which suction is released, an air flow that presses the component by the air hitting the component and a rising air flow caused by the pressed air flow rising at the component are generated, thus a force for peeling off the component from the board is generated by the rising air flow. In the suction nozzle of the present disclosure, since the resistance cavity is formed, a positive pressure is applied by the air whose flow speed is suppressed, and the suction release of the component is performed. Therefore, in the suction nozzle of the present disclosure, the force to peel off the component from the board is unlikely to be generated and thus and the suction release of the component can be more reliably performed.

In the suction nozzle of the present disclosure, the resistance cavity may be a cavity having a slit shape which has a width smaller than the size of the flow path and a length longer than the size of the flow path. In the suction nozzle, the suction release of the component can be more reliably performed by using the resistance cavity having a slit shape. In addition, since the slit shape is easily manufactured, the present disclosure is easy to realize.

In the suction nozzle of the present disclosure, the resistance cavity may be a cavity that includes a first cavity having a slit shape which has a width smaller than the size of the flow path and a length longer than the size of the flow path, and a second cavity formed on a side of the cavity portion, the second cavity having a slit shape which has a sectional area larger than that of the first cavity. In the suction nozzle, since resistance cavity is used by multiple stages of the first cavity and the second cavity, the suction release of the component can be more reliably performed. In addition, since the slit shape is easily manufactured, the present disclosure is easy to realize, which is preferable.

In the suction nozzle of the present disclosure, the resistance cavity may have a sectional area in a range of 80% to 120% of the sectional area of the flow path. In other words, in the suction nozzle, the resistance cavity may have a sectional area which is substantially equal to the sectional area of the flow path. In the suction nozzle, efficiency during suction is good and the suction release is likely to be performed. When a ratio of the sectional area of the resistance cavity to the sectional area of the flow path (also referred to as sectional area ratio) is 80% or more, it is likely to and preferable to apply a positive pressure when the suction release of the component is performed. On the other hand, when the sectional area ratio is 120% or less, it is easy to apply a negative pressure when the suction of the component is performed and the efficiency of component suction is good. The sectional area ratio is more preferably in a range of 90% to 110% and further preferably in a range of 95% to 105%.

In the suction nozzle of the present disclosure, the suction pad portion may have a rectangular suction surface and the cavity portion may be formed in the suction pad has a flat plate shape. With the suction nozzle, a relatively large component having a rectangular upper face picked up more reliably.

In the suction nozzle of the present disclosure, the resistance cavity may be a cavity having a wall section in a direction orthogonal to a flowing direction of the air in the flow path, and one or more of the cavity portions may communicate with the wall section. In the suction nozzle, resistance cavity which causes resistance and decreases the air flow speed when a positive pressure is applied can be formed using the wall section.

DESCRIPTION OF EMBODIMENTS

Figure 1:
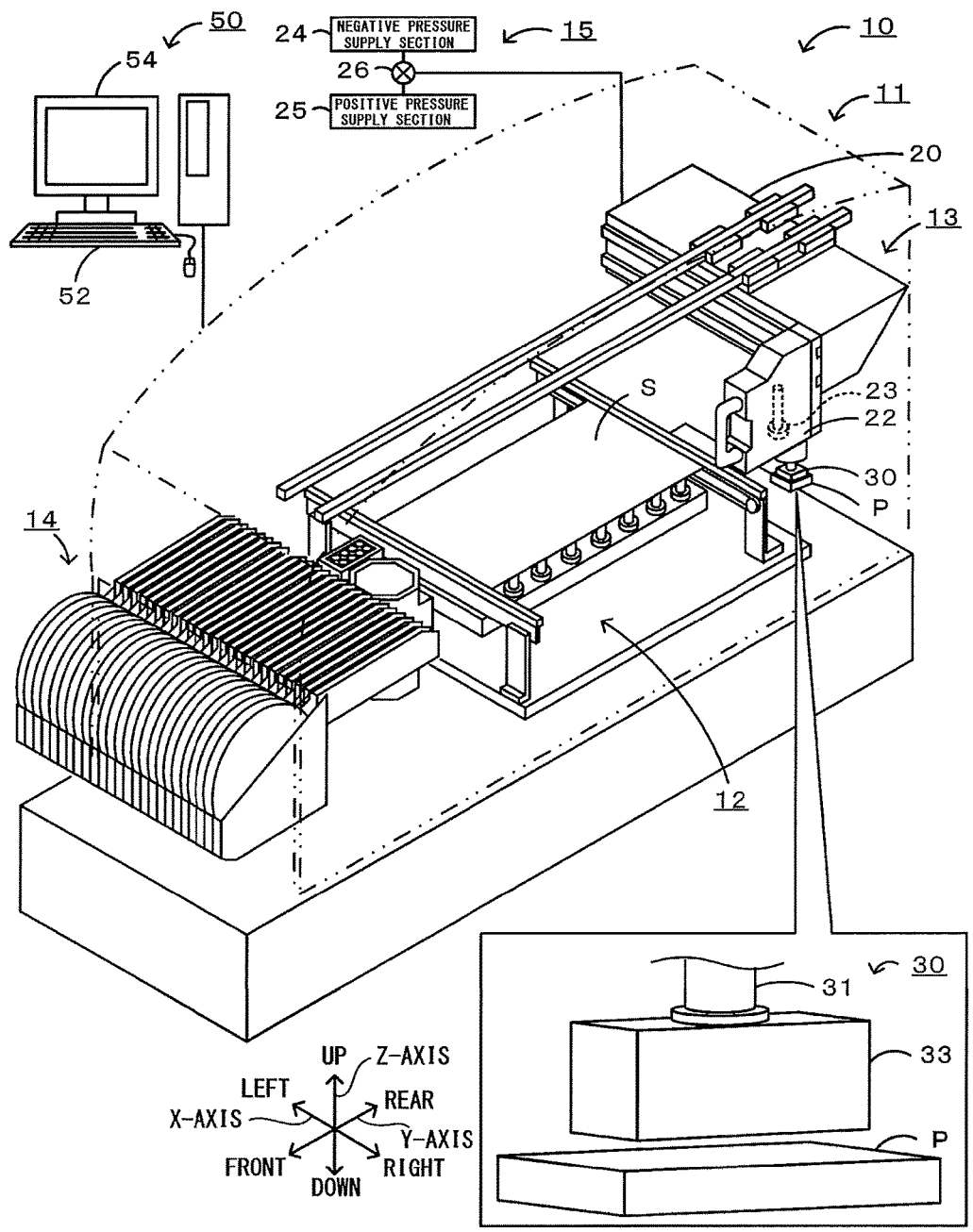
FIG. 1 is a schematic explanatory view illustrating an example of a mounting system 10.
Figure 2:
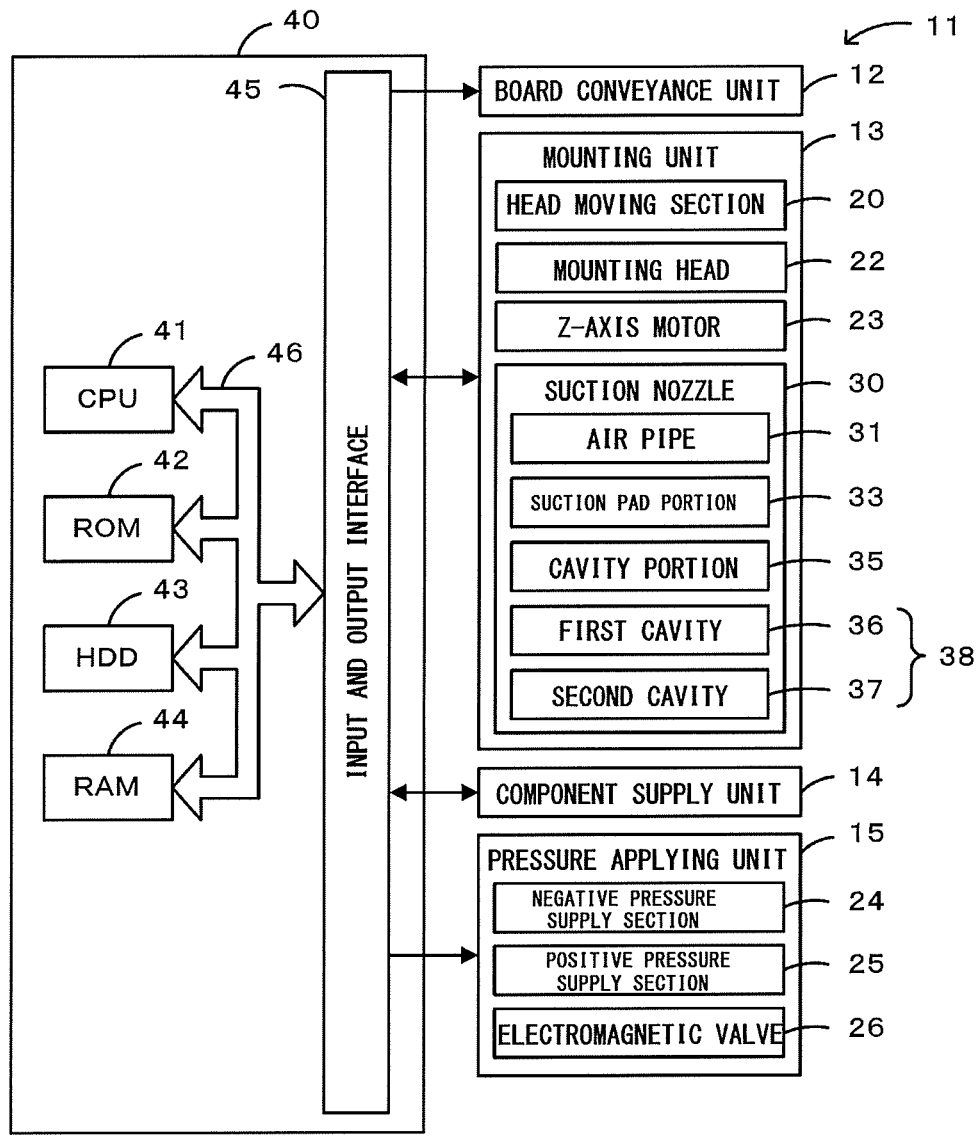
FIG. 2 is a block diagram illustrating a configuration of a mounting device 11.
Figure 3:
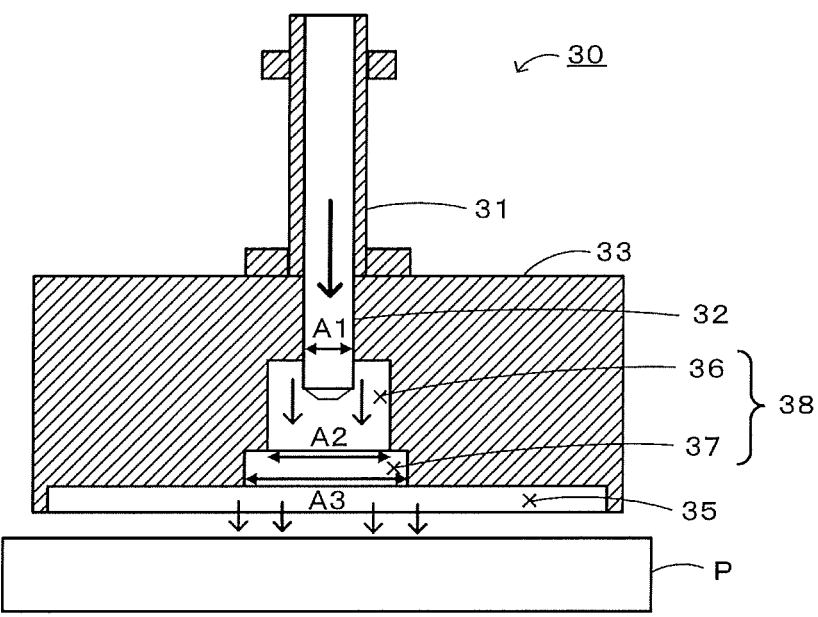
FIG. 3 is an explanatory view of a suction nozzle 30 having a suction pad portion 33.
Figure 3:
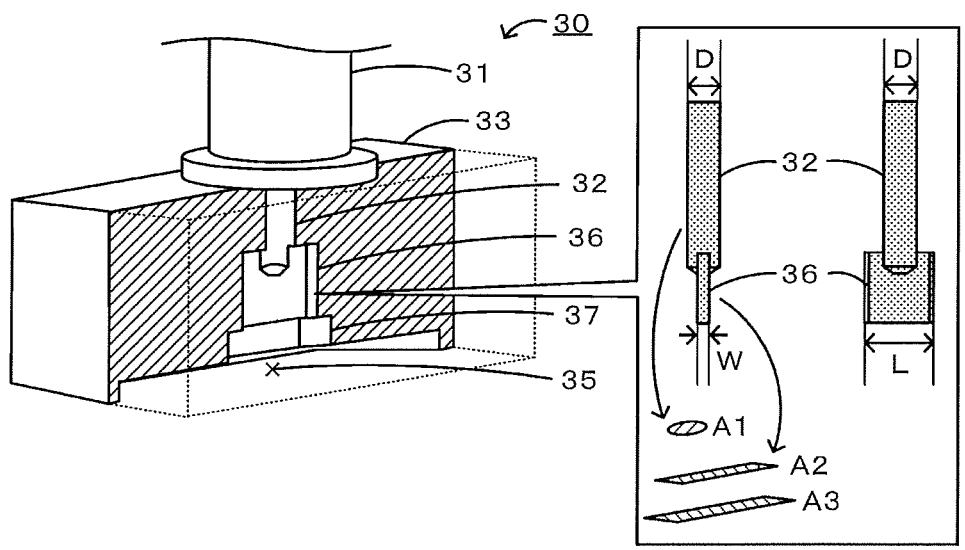

Preferred embodiments of the present disclosure will be described below with reference to the drawings. FIG. 1 is a schematic explanatory view illustrating an example of a mounting system 10. FIG. 2 is a block diagram illustrating a configuration of amounting device 11. FIG. 3 is an explanatory view of a suction nozzle 30 having a suction pad portion 33, FIG. 3($a$) is a sectional view thereof, and FIG. 3($b$) is a perspective view of a section thereof. The mounting system 10 is a system which performs a mounting process related to a process of mounting a component P on a board S. The mounting system 10 includes the mounting device 11 and a management computer 50. In the mounting system 10, multiple mounting devices 11 for performing the mounting process of mounting the component P on the board S are disposed from an upstream to a downstream thereof. In FIG. 1, only one mounting device 11 is illustrated for convenience of explanation. In the present embodiment, the left-right direction (X-axis), the front-back direction (Y-axis), and the up-down direction (Z-axis) are as illustrated in FIG. 1.

As illustrated in FIG. 1 and FIG. 2, the mounting device 11 includes a board conveyance unit 12, a mounting unit 13, a component supply unit 14, a pressure applying unit 15, and a control device 40. The board conveyance unit 12 is a unit which performs loading, conveyance, fixing at a mounting position, and unloading of a board S. The board conveyance unit 12 has a pair of conveyor belts provided with intervals in front and rear in FIG. 1 and bridged across in the left-right direction. The board S is conveyed by this conveyor belt.

The mounting unit 13 collects a component P from the component supply unit 14 and places the component on the board S fixed to the board conveyance unit 12. The mounting unit 13 includes a head moving section 20, a mounting head 22, and a suction nozzle 30. The head moving section 20 includes a slider which is guided by a guide rail and moves in the XY-directions and a motor which drives the slider. The mounting head 22 is detachably mounted on the slider and moves in the XY-directions by the head moving section 20. One or more suction nozzles 30 are detachably mounted on a lower face of the mounting head 22. The mounting head 22 incorporates a Z-axis motor 23, and the height of the suction nozzle 30 is adjusted along the Z-axis by the Z-axis motor 23. In addition, the mounting head 22 includes a rotating device which rotates (revolves) the suction nozzle 30 by a driving motor (not illustrated) and can adjust an angle of the component P sucked by the suction nozzle 30.

The component supply unit 14 includes multiple reels and is detachably attached to a front side of the mounting device 11. A tape is wound around each reel and on the surface of the tape, multiple components P are held along the longitudinal direction of the tape. This tape is unwound from the reel toward the rear side and is sent out by a feeder section to a collection position where a component is sucked by the suction nozzle 30 in a state where a component P is exposed.

The pressure applying unit 15 is a unit for applying a negative pressure or a positive pressure to the mounting head 22. The pressure applying unit 15 includes a negative pressure supply section 24, a positive pressure supply section 25, and an electromagnetic valve 26. The negative pressure supply section 24 includes a vacuum pump or the like and supplies a negative pressure to the mounting head 22. The positive pressure supply section 25 includes a normal pressure pipe, a pressure pump, or the like and supplies a positive pressure to the mounting head 22. The electromagnetic valve 26 switches a path for supplying a negative pressure and a positive pressure to the mounting head 22. The mounting head 22 sucks the component P to the suction nozzle 30 by the negative pressure supplied from the negative pressure supply section 24 through the electromagnetic valve 26. In addition, the mounting head 22 releases the suction of the component P from the suction nozzle 30 by the positive pressure supplied from the positive pressure supply section 25 through the electromagnetic valve 26.

The suction nozzle 30 collects the component P by using pressure and is detachably mounted on the mounting head 22. As illustrated in FIG. 3, the suction nozzle 30 is configured to suck and hold a relatively large component P. The component P has an abutting surface which is a flat upper face formed in substantially parallel to the bottom face. The suction nozzle 30 includes an air pipe 31 and a suction pad portion 33. In the air pipe 31, cylindrical cavity through which air flows is formed therein. The air pipe 31 is connected to a pipe of the mounting head 22 and a negative pressure and a positive pressure are supplied from the pressure applying unit 15.

The suction pad portion 33 has a shape larger than that of the air pipe 31, is formed at a tip of the air pipe 31, and is a portion that abuts on the component P. The suction pad portion 33 has a rectangular parallelepiped (or cubic) outer shape and has a rectangular suction surface which is formed with a smaller area than the abutting surface of the component P which is a suction target. The suction pad portion 33 has a cavity portion 35, which is a cavity formed between the suction pad portion 33 and the component P, on the suction surface (lower face) side thereof. The cavity portion 35 is formed as a cavity having a flat plate shape which has an elliptical bottom face and an elliptical upper face. In the suction pad portion 33, since the contact area between the component P and the cavity portion 35 is relatively large, a negative pressure is likely to be applied to the component P at the time of the suction, and a positive pressure is likely to be applied to the component P at the time of the suction release. In addition, in the suction pad portion 33, resistance cavity 38 which causes resistance and decreases air flow speed when a positive pressure is applied is formed between the flow path 32 and the cavity portion 35. The resistance cavity 38 is formed as a cavity having a slit shape which has a width W smaller than the size (diameter D) of the flow path 32 and a length L longer than the size (diameter D) of the flow path 32 (see take-out view of FIG. 3($b$)). More specifically, the resistance cavity 38 has a first cavity 36 having a slit shape which is formed on a side of the cavity portion 35 and has a width W smaller than the diameter D of the flow path 32 and a length L longer than the diameter of the flow path 32 and a second cavity 37 having a slit shape which has a sectional area A3 larger than a sectional area A2 of the first cavity 36. The resistance cavity 38 may have a sectional area A2 of the first cavity 36 in a range of 80% to 120% of the sectional area A1 (see FIG. 3) of the flow path 32. In other words, in the suction nozzle 30, the first cavity 36 having a sectional area A2 substantially equals to the sectional area of the flow path 32 is formed. In the suction nozzle 30, the efficiency during suction is good and the suction release is likely to be performed. In a state where a ratio (A2/A1×100, also referred to as sectional area ratio) of the sectional area A2 of the first cavity 36 to the sectional area A1 of the flow path 32 is 80% or more, when the suction release of the component P is performed, a positive pressure is likely to be applied and is preferable. On the other hand, when the sectional area ratio is 120% or less, a negative pressure is likely to be applied and the efficiency of the component suction is good when the suction of the component P is performed. The sectional area ratio is more preferably in a range of 90% to 110% and further preferably in a range of 95% to 105%.

As illustrated in FIG. 2, the control device 40 is configured as a microprocessor with CPU 41 as a center, and includes a ROM 42 that stores processing programs, an HDD 43 that stores various data, a RAM 44 In other words used as a work area, an input and output interface 45 for exchanging electric signal with external devices, and the like, which are connected through a bus 46. The control device 40 outputs control signals to the board conveyance unit 12, the mounting unit 13, the component supply unit 14, and the pressure applying unit 15, and inputs signals from the mounting unit 13 and the component supply unit 14.

The management computer 50 is a computer that manages information of each device of the mounting system 10. The management computer 50 includes an input device 52 such as a keyboard and a mouse for inputting various commands by an operator and a display 54 for displaying various kinds of information.

Next, the operation of the mounting system 10 of the present embodiment configured as described above, first, the mounting process of the mounting device 11 will be described. Here, a case where the component P is mounted using the suction nozzle 30 will be described as a specific example. When the mounting process is started, the CPU 41 of the control device 40, for example, controls the pressure applying unit 15 and the mounting unit 13 so that the suction nozzle 30 corresponding to the component P to be collected mounts on the mounting head 22 and a negative pressure is supplied the suction nozzle 30 in order to collect the component P from the component supply unit 14. Next, in a state where the mounting head 22 is moved to an arrangement position on the board S and then the component P is placed on the board S, the CPU 41 controls the pressure applying unit 15 and the mounting unit 13 to supply a positive pressure to the suction nozzle 30. The suction nozzle 30 supplied with a positive pressure performs the suction release of the component P. The CPU 41 repeatedly performs such process until all the disposition of the component P on the board S is completed.

Figure 4:
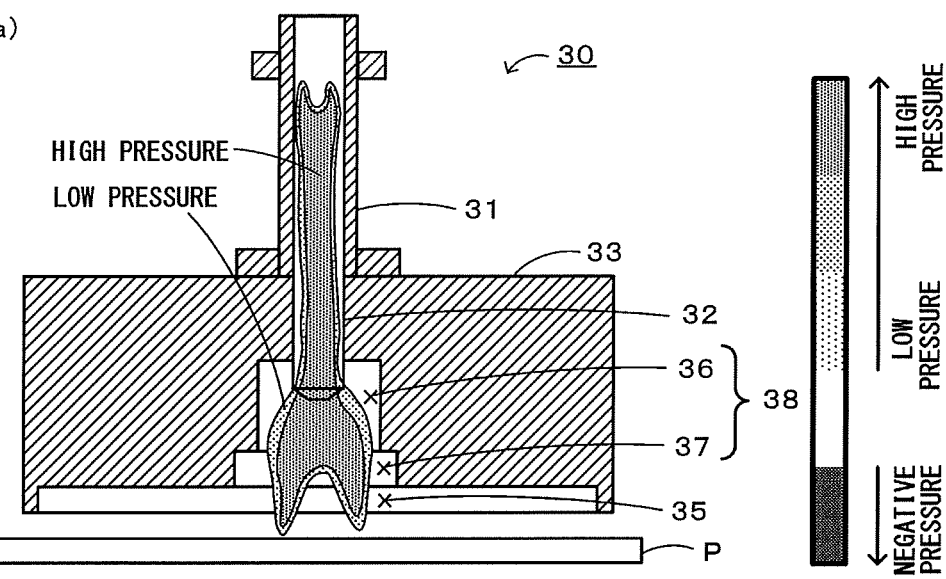
FIG. 4 is an explanatory view when a positive pressure is applied to the suction nozzle 30 to perform suction release of a component P.
Figure 4:
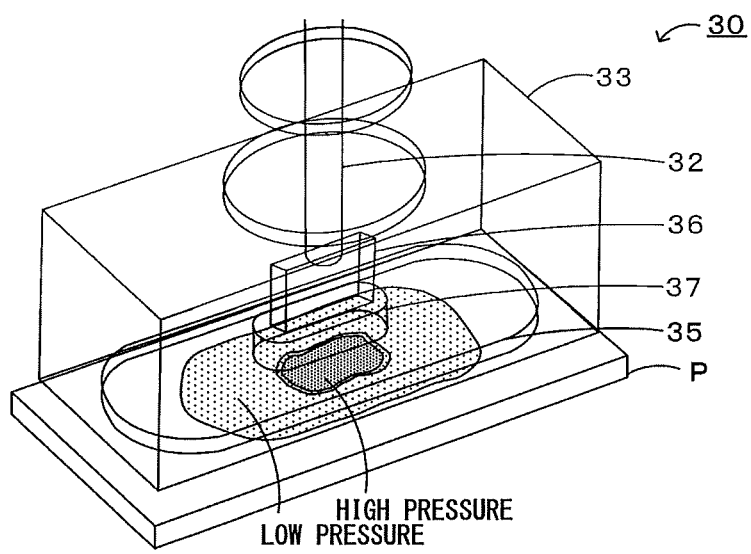
Figure 5:
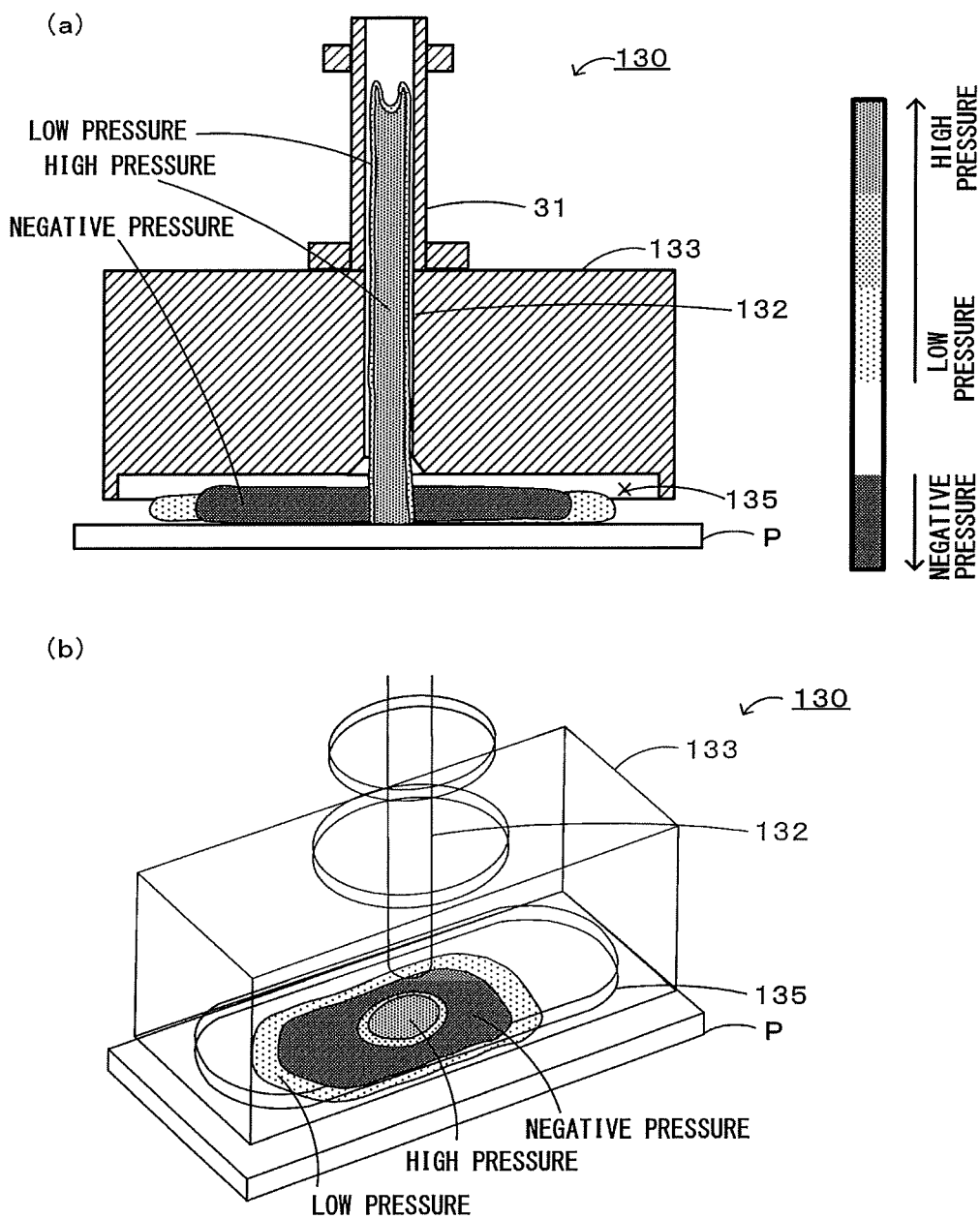
FIG. 5 is an explanatory view when a positive pressure is applied to the suction nozzle 130 to perform suction release of the component P.

Here, a case where the suction nozzle 30 performs the suction release of the component P will be described in more detail. FIG. 4 is an explanatory view when a positive pressure is applied to the suction nozzle 30 to perform the suction release of a component P, FIG. 4(a) is a sectional view thereof from the side, and FIG. 4(b) is a transparent perspective view thereof. FIG. 5 is an explanatory view when a positive pressure is applied to a suction nozzle 130 to perform suction release of a component P without forming the resistance cavity 38, FIG. 5(a) is a sectional view thereof from the side, and FIG. 5(b) is a transparent perspective view thereof. In FIG. 4 and FIG. 5, when a positive pressure is supplied to the suction nozzles 30 and 130, an internal pressure from the flow path 32 to the cavity portion 35 is illustrated. Generally, in the mounting of the component P, the control device 40 supplies a positive pressure air and performs an operation for setting the internal pressure of the suction nozzle to the atmospheric pressure or a positive pressure in order to place the sucked component P to the board S. At this time, depending on the shape of the suction nozzle, a force for peeling off the disposed component P from the board S may be generated as the positive pressure is supplied. Particularly, when the suction nozzle is raised while a positive pressure is supplied, an upward force may be applied to the component P. For example, in the suction nozzle 130 of the related art, as illustrated in FIG. 5, a suction pad portion 133 communicating with a cavity portion 135 substantially directly from a flow path 132 is provided. In the suction nozzle 130, air having an area corresponding to the sectional area of the flow path 132 reaches the component P in a pinpoint manner (FIG. 5). On the surface of the component P at which suction is released, an air flow which presses the component P by the air hitting the component and a rising air flow caused by the pressed air flow rising at the component P are generated, and a negative pressure is generated by the rising air flow, and thus a force for peeling off the component P from the board S is generated. Regarding this, in the suction nozzle 30, the resistance cavity 38 is formed between the flow path 32 and the cavity portion 35 which causes resistance and decreases the air flow speed when a positive pressure is applied. In the suction nozzle 30, a flow of air is dispersed in the resistance cavity 38 (see solid line arrow in FIG. 3(a)), positive pressure is applied to a wide area by the air whose flow speed is suppressed, and thus the suction release of the component P is performed (FIG. 4). Therefore, in the suction nozzle 30, when a positive pressure is applied, generation of a negative pressure on the surface of the component P due to the flow of air can be reduced.

Here, the correspondence relationship between the constituent elements of the present embodiment and the constituent elements of the present disclosure will be clarified. The air pipe 31 of the present embodiment corresponds to the air pipe of the present disclosure, the suction pad portion 33 corresponds to the suction pad portion, and the first cavity 36, the second cavity 37 and the resistance cavity 38 corresponds to the resistance cavity.

According to the suction nozzle 30 of the embodiment described above, the suction pad portion 33 formed to be larger than the air pipe 31 is provided at the tip of the air pipe 31, and the resistance cavity 38 which causes resistance and decreases air flow speed when a positive pressure is applied, are formed between the flow path 32 and the cavity portion 35. In the suction nozzle 30, since the resistance cavity 38 is formed, a positive pressure is applied by the air whose flow speed is suppressed and the suction release of the component P is performed. Therefore, in the suction nozzle 30, a force for peeling off the component P from the board S is unlikely to be generated and the suction release of the component P can be more reliably performed.

In addition, the resistance cavity 38 includes the first cavity 36 having a slit shape which has a width smaller than the diameter of the flow path 32 and a length longer than the diameter of the flow path 32, and the second cavity 37 having a slit shape which is formed on the cavity portion 35 side and has a sectional area larger than that of the first cavity 36. In this manner, since the suction nozzle 30 uses the resistance cavity 38 by the multiple stages of the first cavity 36 and the second cavity 37, the suction release of the component P can be more reliably performed. In addition, since the slit shape is easily manufactured, the present disclosure is easy to realize, which is preferable. Further, the first cavity 36 of the resistance cavity 38 has a sectional area in a range of 80% to 120% of the sectional area of the flow path 32, that is, the resistance cavity 38 having the sectional area substantially equals to the sectional area of the flow path 32 are formed. In the suction nozzle, efficiency during suction is good and the suction release is likely to be performed. Furthermore, since the suction pad portion 33 has a rectangular suction surface and the cavity portion 35 formed in the suction pad portion 33 has a flat plate shape, a relatively large component having a rectangular upper face is picked up more reliably.

The present disclosure is not limited to the embodiment described above at all and can be implemented in various modes as long as it falls within the technical scope of the present disclosure.

For example, in the embodiment described above, although the resistance cavity 38 is described as being configured by multiple stages of the first cavity 36 and the second cavity 37, it is not particularly limited thereto, and the resistance cavity may be configured by one stage of the resistance cavity formed only the first cavity 36 and may be configured by three or more stages of the resistance cavity in which the other resistance cavity is formed. Even with such a suction nozzle, a force for peeling off the component P from the board S is unlikely to be generated and the suction release of the component P can be more reliably performed.

Figure 6:
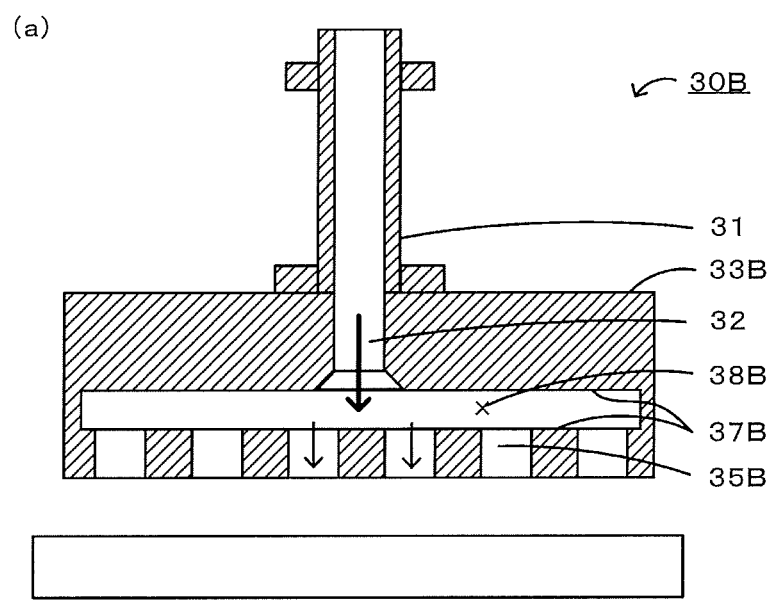
FIG. 6 is an explanatory view of a suction nozzle 30B having another suction pad portion 33B.
Figure 6:
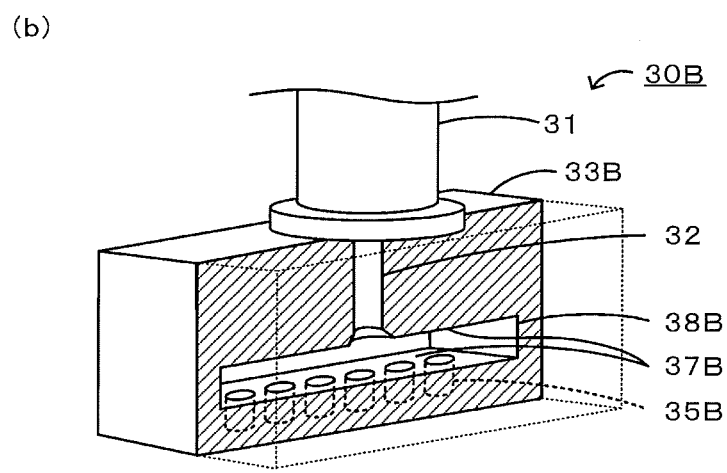

In the embodiment described above, although the resistance cavity 38 is a cavity having a slit shape, if being a cavity which causes resistance and decreases the air flow speed when a positive pressure is applied, they are not particularly limited to a cavity having a slit shape. In addition, in the embodiment described above, although the cavity portion 35 is a cavity having a plate shape, it is not particularly limited thereto. FIG. 6 is an explanatory view of a suction nozzle 30B having another suction pad portion 33B, FIG. 6(a) is a sectional view thereof, and FIG. 6(b) is a sectional perspective view thereof. The suction nozzle 30B includes a wall section 37B in a direction orthogonal to the flowing direction of the air in the flow path 32 and includes a resistance cavity 38B formed by the wall section 37B. In addition, in the suction nozzle 30B, one or more of a cavity portions 35B communicate with the wall section 37B. The cavity portion 35B is formed as a cylindrical cavity. Even in the suction nozzle 30B, a force for peeling off the component P from the board S is unlikely to be generated and the suction release of the component P can be more reliably performed. In addition, in the suction nozzle 30B, the resistance cavity 38B which causes resistance and decreases the air flow speed when a positive pressure is applied can be formed using the wall section 37B.

In the embodiment described above, although the suction pad portion 33 has a rectangular suction surface, it is not limited thereto, and it can be various shapes such as an elliptical suction surface, or a polygonal suction surface according to the shape of the component P. In the embodiment described above, although the suction pad portion 33 has a rectangular parallelepiped (or cubic) outer shape, it is not particularly limited thereto, and for example, it can be various shapes such as a polygonal columnar body, a conical shape, a cylindrical shape, and an elliptical shape at the bottom face.

INDUSTRIAL APPLICABILITY

The present disclosure can be used to a mounting device which disposes components on a board.

REFERENCE SIGNS LIST

10: mounting system, 11: mounting device, 12: board conveyance unit, 13: mounting unit, 14: component supply unit, 15: pressure applying unit, 20: head moving section, 22: mounting head, 23: Z-axis motor, 24: negative pressure supply section, 25: positive pressure supply section, 26: electromagnetic valve, 30, 30B, 130: suction nozzle, 31: air pipe, 32: flow path, 33, 33B, 133: suction pad portion, 35, 35B: cavity portion, 36: first cavity, 37: second cavity, 37B: wall section, 38, 38B: resistance cavity, 40: control device, 41: CPU, 42: ROM, 43: HDD, 44: RAM, 45: input and output interface, 46: bus, 50: management computer, 52: input device, 54: display, P: component, S: board

The invention claimed is:

1. A suction nozzle used in a mounting device for mounting a component on a board, comprising:
   an air pipe; and
   a suction pad portion which has a flow path communicating with the air pipe, has a cavity portion between the suction pad portion and the component, abuts on the component, and is formed to be larger than the air pipe at a tip of the air pipe,
   wherein a resistance cavity which causes resistance and decreases air flow speed when a positive pressure is applied is formed between the flow path and the cavity portion,
   wherein the resistance cavity includes a first cavity having a slit shape which has a width smaller than a size of the flow path and a length longer than a size of the flow path, and a second cavity formed on a side of the cavity portion, the second cavity having a slit shape which has a sectional area larger than that of the first cavity, and
   wherein the length and width are perpendicular to the flow path in the air pipe.

2. The suction nozzle according to claim 1,
   wherein the resistance cavity is a cavity having a slit shape which has a width smaller than a size of the flow path and a length longer than a size of the flow path.

3. The suction nozzle according to claim 1,
   wherein the resistance cavity is a cavity having a wall section in a direction orthogonal to a flowing direction of air in the flow path and one or more of the cavity portions communicate with the wall section.

4. The suction nozzle according to claim 1,
   wherein the resistance cavity has a sectional area in a range of 110% to 120% of a sectional area of the flow path.

5. The suction nozzle according to claim 1,
   wherein the suction pad portion has a rectangular suction surface, the cavity portion formed in the suction pad portion has a flat plate shape.

* * * * *